United States Patent
Baburske et al.

(10) Patent No.: US 10,332,973 B2
(45) Date of Patent: Jun. 25, 2019

(54) N-CHANNEL BIPOLAR POWER SEMICONDUCTOR DEVICE WITH P-LAYER IN THE DRIFT VOLUME

(71) Applicant: Infineon Technologies AG, Neubiberg (DE)

(72) Inventors: Roman Baburske, Otterfing (DE); Markus Bina, Sauerlach (DE); Hans-Joachim Schulze, Taufkirchen (DE); Oana Julia Spulber, Neubiberg (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 15/986,301

(22) Filed: May 22, 2018

(65) Prior Publication Data
US 2018/0269304 A1    Sep. 20, 2018

Related U.S. Application Data

(63) Continuation of application No. 15/647,885, filed on Jul. 12, 2017, now Pat. No. 9,978,851.

(30) Foreign Application Priority Data

Jul. 12, 2016   (DE) .................. 10 2016 112 721

(51) Int. Cl.
*H01L 29/66* (2006.01)
*H01L 29/06* (2006.01)
(Continued)

(52) U.S. Cl.
CPC .... *H01L 29/66333* (2013.01); *H01L 29/0619* (2013.01); *H01L 29/0623* (2013.01);
(Continued)

(58) Field of Classification Search
CPC ................................. H01L 29/66333
See application file for complete search history.

(56) References Cited

U.S. PATENT DOCUMENTS 5,895,939 A    4/1999   Ueno
7,808,003 B2   10/2010  Endo et al.
(Continued)

FOREIGN PATENT DOCUMENTS

JP      2003-017700    1/2003
JP      2004-146679    5/2004
(Continued)

*Primary Examiner* — William Coleman
(74) *Attorney, Agent, or Firm* — Dicke, Billig & Czaja, PLLC

(57) ABSTRACT

A power semiconductor device having a semiconductor body configured to conduct a load current is disclosed. In one example, the device includes a source region having dopants of a first conductivity type; a semiconductor channel region implemented in the semiconductor body and separating the source region from a remaining portion of the semiconductor body; a trench of a first trench type extending in the semiconductor body along an extension direction and being arranged adjacent to the semiconductor channel region, the trench of the first trench type including a control electrode that is insulated from the semiconductor body. The semiconductor body further comprises: a barrier region and a drift volume having at least a first drift region wherein the barrier region couples the first drift region with the semiconductor channel region.

20 Claims, 10 Drawing Sheets

(51) Int. Cl.
    *H01L 29/10*   (2006.01)
    *H01L 29/739*  (2006.01)
    *H01L 29/78*   (2006.01)
    *H01L 29/36*   (2006.01)
    *H01L 29/08*   (2006.01)

(52) U.S. Cl.
    CPC ...... *H01L 29/0634* (2013.01); *H01L 29/0649* (2013.01); *H01L 29/1095* (2013.01); *H01L 29/36* (2013.01); *H01L 29/66348* (2013.01); *H01L 29/7391* (2013.01); *H01L 29/7397* (2013.01); *H01L 29/7813* (2013.01); *H01L 29/0696* (2013.01); *H01L 29/0834* (2013.01)

(56) References Cited

U.S. PATENT DOCUMENTS

| | | |
|---|---|---|
| 7,812,392 B2 | 10/2010 | Saito et al. |
| 7,964,913 B2 | 6/2011 | Darwish |
| 9,105,470 B2 | 8/2015 | Noebauer |
| 9,276,071 B2 | 3/2016 | Yoshimura |
| 9,373,710 B2 | 6/2016 | Van Treek et al. |
| 9,520,465 B2 | 12/2016 | Yamashita |
| 9,691,892 B2 | 6/2017 | Mauder |
| 2004/0094798 A1 | 5/2004 | Hara et al. |
| 2010/0012951 A1 | 1/2010 | Yatsuo et al. |
| 2015/0091055 A1 | 4/2015 | Gejo et al. |
| 2016/0133741 A1 | 5/2016 | Matsuki et al. |
| 2016/0155831 A1 | 6/2016 | Madathil |

FOREIGN PATENT DOCUMENTS

| | | |
|---|---|---|
| JP | 2009-004547 | 1/2009 |
| JP | 2011-101036 | 5/2011 |
| JP | 2015-072950 | 4/2015 |
| JP | 2015-092593 | 5/2015 |
| JP | 2015-153854 | 8/2015 |
| WO | 2013/136898 | 9/2013 |

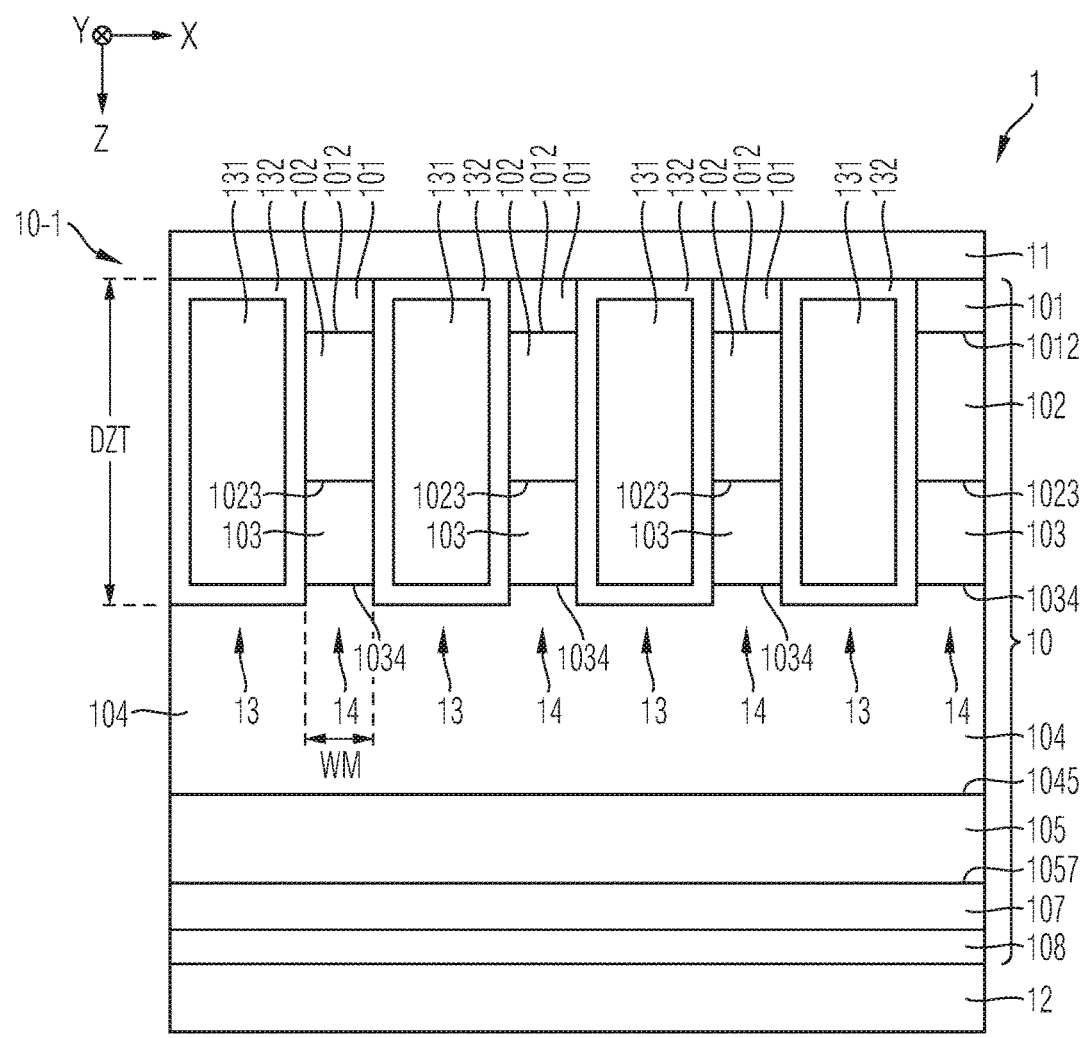

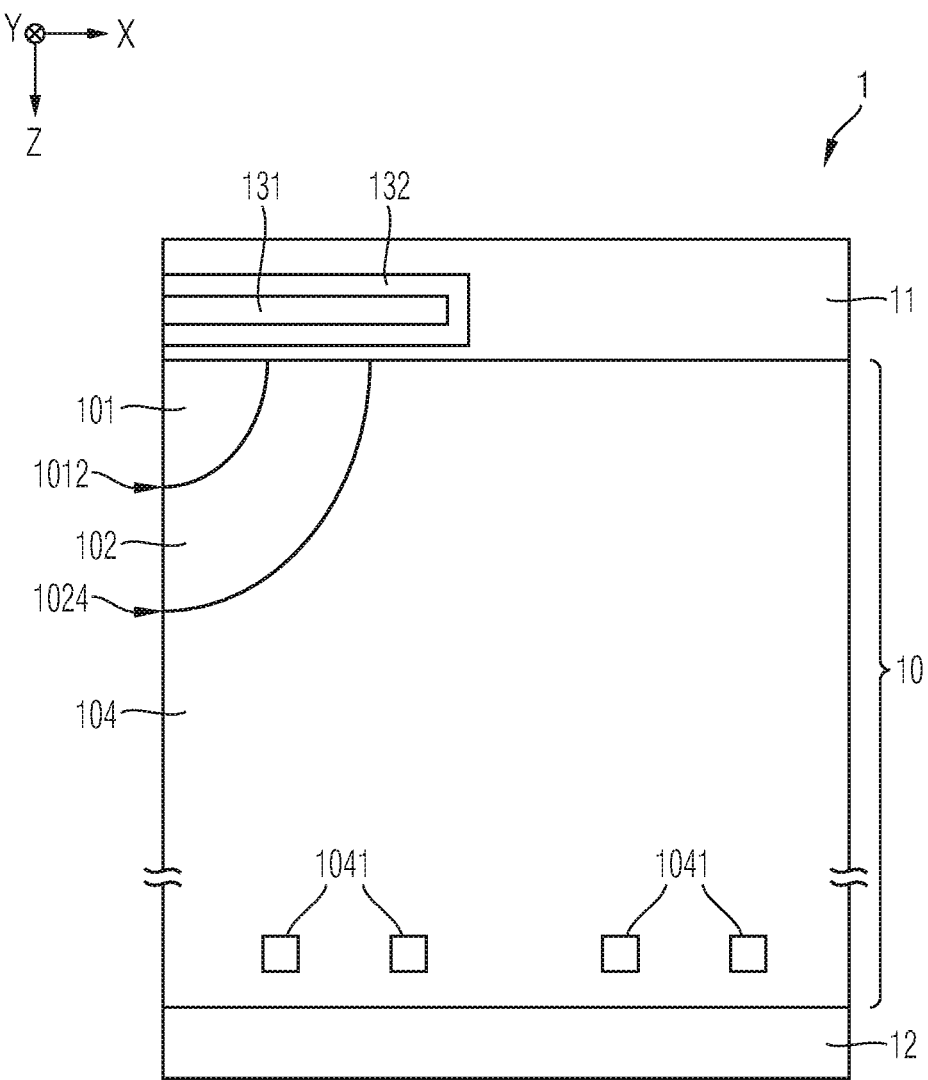

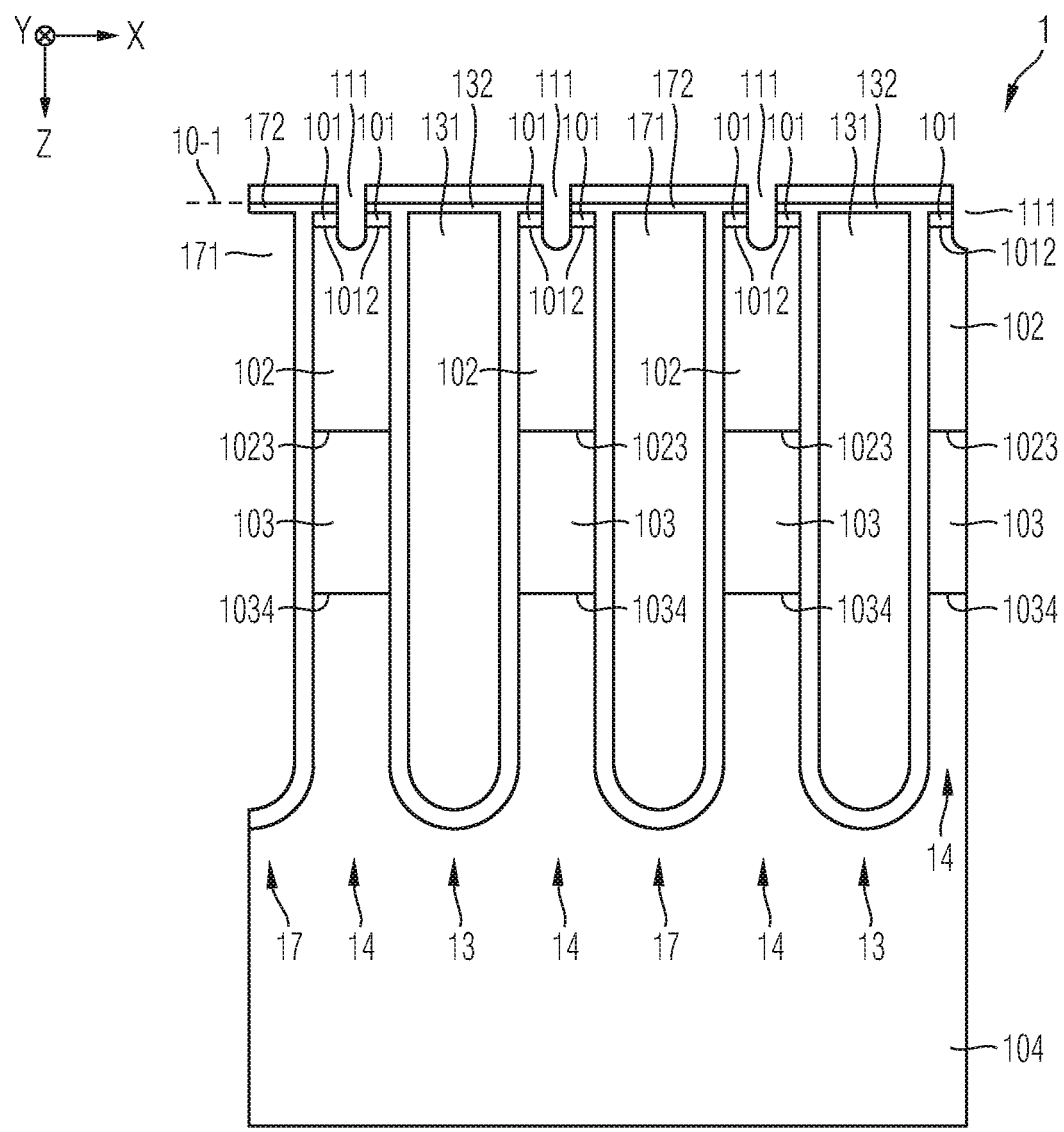

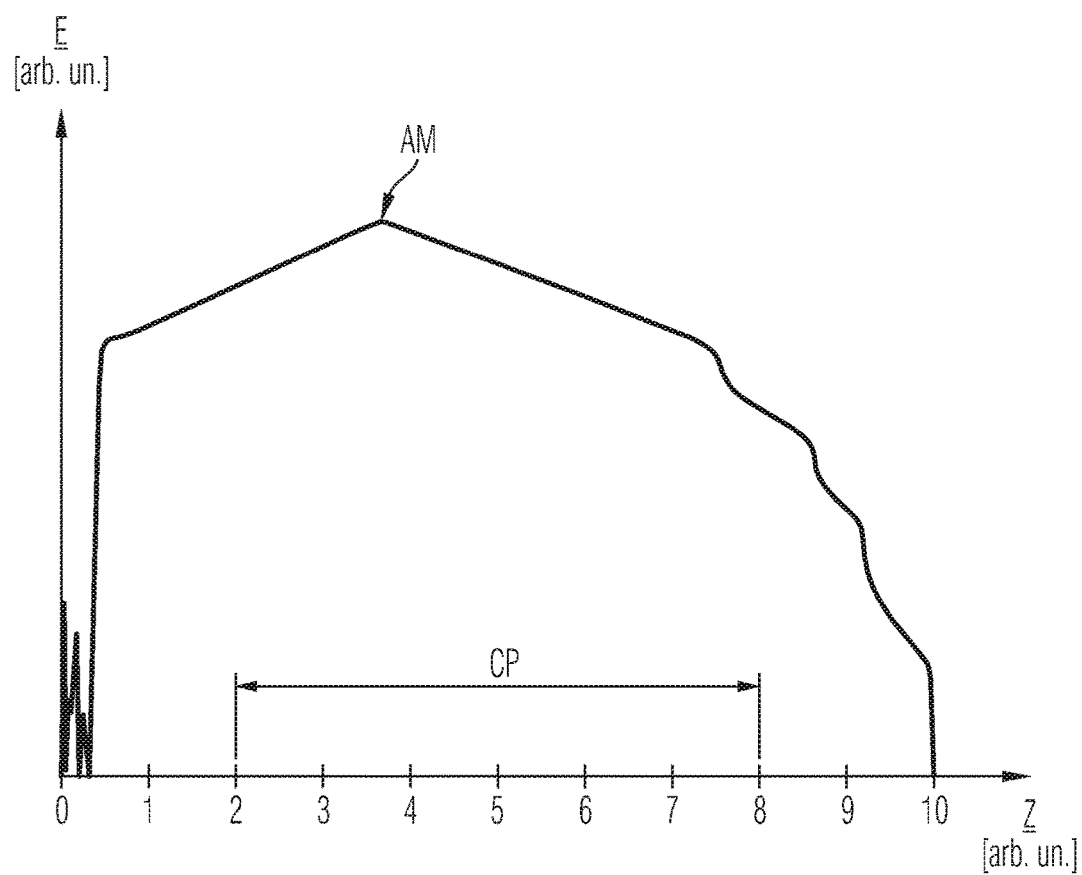

N-CHANNEL BIPOLAR POWER SEMICONDUCTOR DEVICE WITH P-LAYER IN THE DRIFT VOLUME

CROSS-REFERENCE TO RELATED APPLICATION

This Utility Patent Application is a continuation application of U.S. Ser. No. 15/647,885 filed Jul. 12, 2017 and claims priority to German Patent Application No. 10 2016 112 721.3, filed Jul. 12, 2016, which is incorporated herein by reference.

TECHNICAL FIELD

This specification refers to embodiments of a bipolar power semiconductor device and to embodiments of a method of processing a bipolar power semiconductor device. In particular, this specification is directed to embodiments of an n-channel power semiconductor device having a p-layer in the drift volume and to corresponding embodiments of a power semiconductor device processing method.

BACKGROUND

Many functions of modern devices in automotive, consumer and industrial applications, such as converting electrical energy and driving an electric motor or an electric machine, rely on power semiconductor devices. For example, Insulated Gate Bipolar Transistors (IGBTs), Metal Oxide Semiconductor Field Effect Transistors (MOSFETs) and diodes, to name a few, have been used for various applications including, but not limited to switches in power supplies and power converters.

A power semiconductor device usually comprises a semiconductor body configured to conduct a load current along a load current path between two load terminals of the device. Further, the load current path may be controlled by means of an insulated control electrode, sometimes referred to as gate electrode. For example, upon receiving a corresponding control signal from, e.g., a driver unit, the control electrode may set the power semiconductor device in one of a conducting state, also referred to as on-state, and a blocking state, also referred to as off-state.

For a given application, a power semiconductor device may have to comply with some ratings regarding, e.g., a minimum voltage blocking capability and/or a minimum nominal load current capability, to a name a few examples. In an exemplary application, a power semiconductor device, e.g., having an IGBT configuration, may be coupled to a DC link, e.g., a capacitor, and may be used for a DC-DC and/or a DC-AC conversion. Then, a requirement regarding a minimum voltage blocking capability could state that a minimum blocking voltage of said power semiconductor device has to amount to at least twice of the maximum of the DC link voltage, in an example.

On the other side, a given application shall usually exhibit a high degree of efficiency. To this end, beyond said ratings, it may additionally be desirable that the power semiconductor device used within the application exhibits low losses, e.g., low on-state and/or low switching losses. Said losses are usually proportional to the ratings, e.g., the higher the voltage blocking capability of a device, the higher are usually also its on-state losses.

SUMMARY

According to an embodiment, a bipolar power semiconductor device (in the following also referred to as "power semiconductor device") having a semiconductor body configured to conduct a load current between its first load terminal and its second load terminal comprises: a source region of a first conductivity type and being electrically connected to the first load terminal; a semiconductor channel region implemented in the semiconductor body and having a second conductivity type and separating the source region from a remaining portion of the semiconductor body; a trench of a first trench type extending in the semiconductor body along an extension direction and being arranged adjacent to the semiconductor channel region, the trench of the first trench type including a control electrode that is insulated from the semiconductor body by an insulator, wherein the control electrode is configured to control a path of the load current in the semiconductor channel region; and at least one emitter region of the second conductivity type that is implemented in the semiconductor body and that is electrically connected to the second load terminal. The semiconductor body further comprises: a barrier region the first conductivity type; and a drift volume having at least a first drift region of the second conductivity type, wherein the barrier region couples the first drift region with the semiconductor channel region. The semiconductor body also comprises a buffer region of the first conductivity type that is arranged between the drift volume of the semiconductor body on one side and the emitter region on the other side, wherein the first drift region has a total extension along the extension direction of at least 5% of the total extension of the semiconductor body along the extension direction.

According to a further embodiment, a bipolar power semiconductor device (in the following also referred to as "power semiconductor device") having a semiconductor body configured to conduct a load current between its first load terminal and its second load terminal comprises: a source region of a first conductivity type and being electrically connected to the first load terminal; a semiconductor channel region implemented in the semiconductor body and having a second conductivity type and separating the source region from a remaining portion of the semiconductor body; a control electrode that is insulated from the semiconductor body by an insulator, wherein the control electrode is configured to control a path of the load current in the semiconductor channel region; and at least one emitter region of the second conductivity type that is implemented in the semiconductor body and that is electrically connected to the second load terminal. The semiconductor body further comprises: a drift volume having at least a first drift region being coupled with the semiconductor channel region and having the second conductivity type; a buffer region of the first conductivity type that is arranged between the drift volume of the semiconductor body on one side and the emitter region on the other side, wherein the first drift region has a total extension along an extension direction of at least 5% of the total extension of the semiconductor body along the extension direction.

According to a yet further embodiment, a method of processing a bipolar power semiconductor device (in the following also referred to as "power semiconductor device") having a semiconductor body comprises: creating a source region with a first conductivity type; creating a semiconductor channel region in the semiconductor body with a second conductivity type such that the semiconductor channel region separates the source region from a remaining portion of the semiconductor body; providing a control electrode for controlling a path of a load current in the semiconductor channel region, and an insulator that insulates the control electrode from the semiconductor body;

creating at least one emitter region of the second conductivity type in the semiconductor body; creating a drift volume having at least a first drift region in the semiconductor body with the second conductivity type such that the first drift region is coupled with the semiconductor channel region; and creating a buffer region of the first conductivity type and being arranged between the drift volume of the semiconductor body on one side and the emitter region on the other side; wherein the first drift region has a total extension along an extension direction of at least 5% of the total extension of the semiconductor body along the extension direction.

Those skilled in the art will recognize additional features and advantages upon reading the following detailed description, and upon viewing the accompanying drawings.

BRIEF DESCRIPTION OF THE DRAWINGS

The parts in the figures are not necessarily to scale, instead emphasis being placed upon illustrating principles of the invention. Moreover, in the figures, like reference numerals designate corresponding parts. In the drawings:

FIGS. 1A-D each schematically and exemplarily illustrate a section of a vertical cross-section of a bipolar power semiconductor device in accordance with some embodiments;

FIG. 2 schematically and exemplarily illustrates a section of a vertical cross-section of a bipolar power semiconductor device in accordance with one or more embodiments;

FIG. 5B schematically and exemplarily illustrates a course of an electric field strength in an extension direction in accordance with one or more embodiments.

DETAILED DESCRIPTION

Figure 1A:
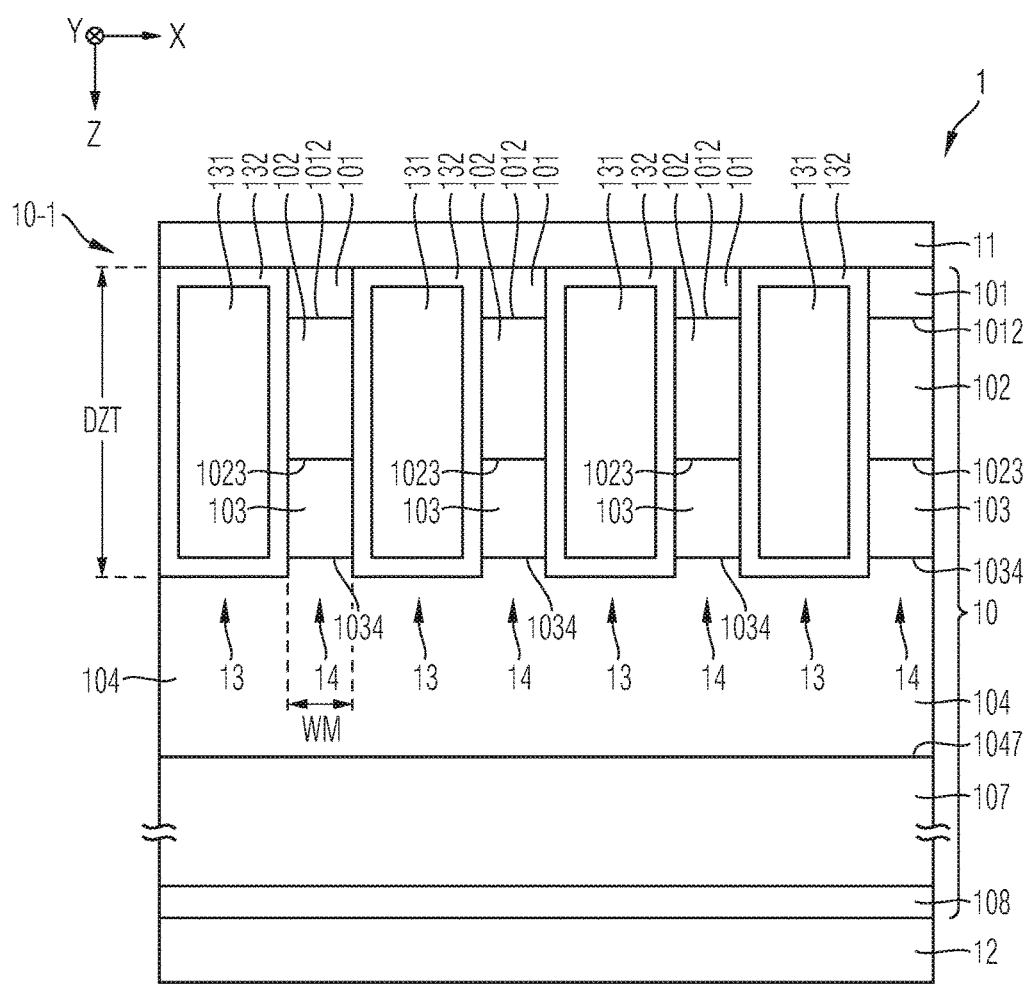

In the following detailed description, reference is made to the accompanying drawings which form a part hereof and in which are shown by way of illustration specific embodiments in which the invention may be practiced.

In this regard, directional terminology, such as "top", "bottom", "below", "front", "behind", "back", "leading", "trailing", "above" etc., may be used with reference to the orientation of the figures being described. Because parts of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Reference will now be made in detail to various embodiments, one or more examples of which are illustrated in the figures. Each example is provided by way of explanation, and is not meant as a limitation of the invention. For example, features illustrated or described as part of one embodiment can be used on or in conjunction with other embodiments to yield yet a further embodiment. It is intended that the present invention includes such modifications and variations. The examples are described using specific language which should not be construed as limiting the scope of the appended claims. The drawings are not scaled and are for illustrative purposes only. For clarity, the same elements or manufacturing steps have been designated by the same references in the different drawings if not stated otherwise.

The term "horizontal" as used in this specification intends to describe an orientation substantially parallel to a horizontal surface of a semiconductor substrate or of a semiconductor structure. This can be for instance the surface of a semiconductor wafer or a die. For example, both the first lateral direction X and the second lateral direction Y mentioned below can be horizontal directions, wherein the first lateral direction X and the second lateral direction Y may be perpendicular to each other.

The term "vertical" as used in this specification intends to describe an orientation which is substantially arranged perpendicular to the horizontal surface, i.e., parallel to the normal direction of the surface of the semiconductor wafer. For example, the extension direction Z mentioned below may be an extension direction that is perpendicular to both the first lateral direction X and the second lateral direction Y.

In this specification, n-doped is referred to as "first conductivity type" while p-doped is referred to as "second conductivity type". Alternatively, opposite doping relations can be employed so that the first conductivity type can be p-doped and the second conductivity type can be n-doped.

Further, within this specification, the term "dopant concentration" may refer to an average dopant concentration or, respectively, to a mean dopant concentration or to a sheet charge carrier concentration of a specific semiconductor region or semiconductor zone. Thus, e.g., a statement saying that a specific semiconductor region exhibits a certain dopant concentration that is higher or lower as compared to a dopant concentration of another semiconductor region may indicate that the respective mean dopant concentrations of the semiconductor regions differ from each other.

In the context of the present specification, the terms "in ohmic contact", "in electric contact", "in ohmic connection", and "electrically connected" intend to describe that there is a low ohmic electric connection or low ohmic current path between two regions, sections, zones, portions or parts of a semiconductor device or between different terminals of one or more devices or between a terminal or a metallization or an electrode and a portion or part of a semiconductor device. Further, in the context of the present specification, the term "in contact" intends to describe that there is a direct physical connection between two elements of the respective semiconductor device; e.g., a transition between two elements being in contact with each other may not include a further intermediate element or the like.

In addition, in the context of the present specification, the term "electric insulation" is used, if not stated otherwise, in the context of its general valid understanding and thus intends to describe that two or more components are positioned separately from each other and that there is no ohmic connection connecting those components. However, components being electrically insulated from each other may nevertheless be coupled to each other, for example mechanically coupled and/or capacitively coupled and/or inductively coupled. To give an example, two electrodes of a capacitor may be electrically insulated from each other and, at the same time, mechanically and capacitively coupled to each other, e.g., by means of an insulation, e.g., a dielectric.

The term "power semiconductor device" as used in this specification intends to describe a semiconductor device on a single chip with high voltage blocking and/or high current carrying capabilities. In other words, such power semiconductor device is configured for a high load current, typically in the Ampere range, e.g., up to several ten or hundred Ampere, and/or high voltages, typically above 5 V, or above 15 V or more typically 400V and, e.g., up to some 1000 Volts.

For example, the term "power semiconductor device" as used in this specification is not directed to logic semiconductor devices that are used for, e.g., storing data, computing data and/or other types of semiconductor based data processing.

Specific embodiments described in this specification thus pertain to, without being limited thereto, a bipolar power semiconductor device (in the following simply also referred to as "semiconductor device" or "device") that may be used within a power converter or a power supply, e.g., for converting a first power signal into a second power signal different from the first power signal. For example, to this end, the bipolar power semiconductor device may comprise one or more power semiconductor cells, such as a monolithically integrated transistor cell, a monolithically integrated diode cell, and/or a monolithically integrated IGBT cell, and/or a monolithically integrated RC-IGBT cell, and/ or a monolithically integrated MOS Gated Diode (MGD) cell, and/or derivatives thereof. Such diode cells and/or such transistor cells may be integrated in a semiconductor chip, wherein a number of such chips may be integrated in a power semiconductor module, such as an IGBT module.

Figure 3A:
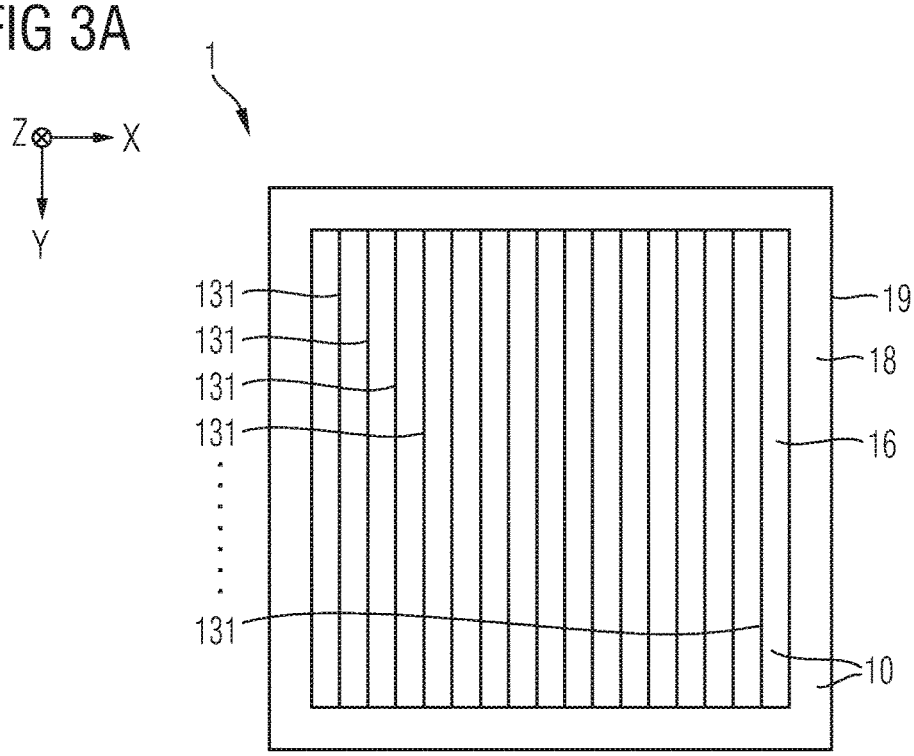
FIG. 3A-B each schematically and exemplarily illustrate a section of a horizontal projection of a bipolar power semiconductor device in accordance with one or more embodiments.
Figure 3B:
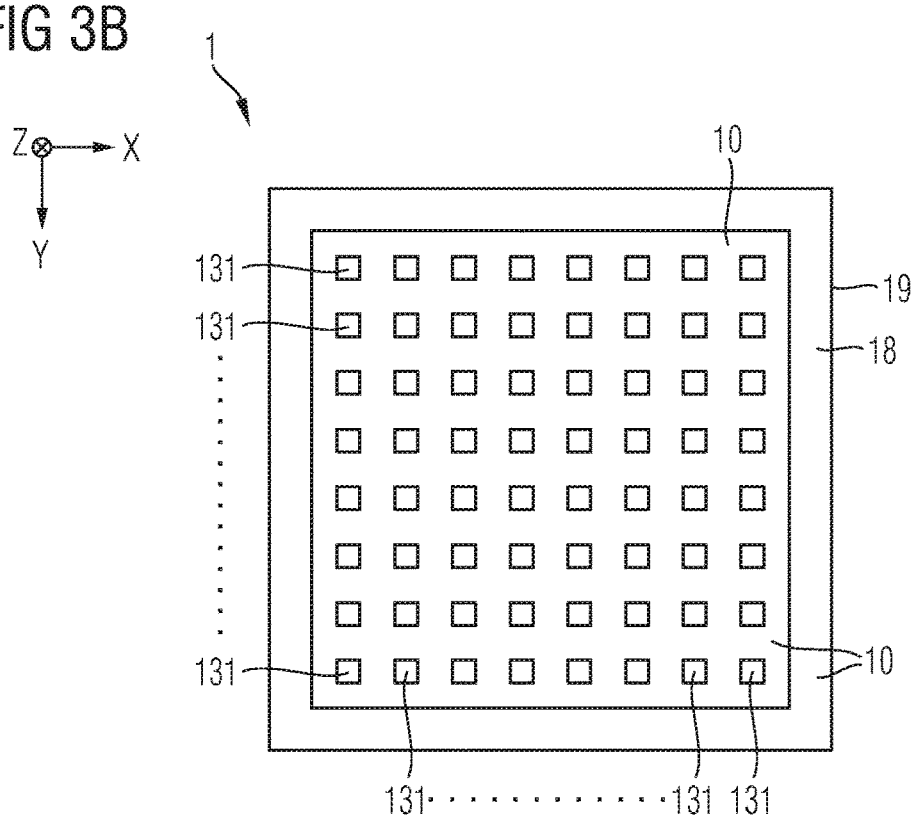

FIG. 3A schematically and exemplarily illustrates a section of a horizontal projection of a bipolar power semiconductor device 1 in accordance with one or more embodiments. In the following, each of the terms "power semiconductor device" and "semiconductor device" refer to a bipolar power semiconductor device. Also FIG. 3B schematically and exemplarily illustrates a section of a horizontal projection of a power semiconductor device 1 in accordance with one or more other embodiments. In both of FIG. 3A and FIG. 3B, the horizontal projection may be in parallel to the plane defined by the first lateral direction X and the second lateral direction Y. The components of the semiconductor device 1 may each extend along the extension direction Z that may be perpendicular to each of the first lateral direction X and the second lateral direction Y.

The semiconductor device 1 may comprise an active cell field 16 that includes one or more active cells, e.g., MOS (Metal Oxide Semiconductor) cells, in the following simply referred to as "cells", wherein each of said cells may comprise at least one control electrode 131. The number of cells may be within the range of 100 to 100000, for example. The active cell field 16 may be configured to conduct a total load current, wherein the total load current may be greater than 1 A, greater than 10 A or even greater than 100 A. In the following, said total toad current is also simply referred to as load current.

The active cell field 16 may be surrounded by an edge termination zone 18 of the semiconductor device 1. For example, the edge termination zone 18 does not include any active cells. The edge termination zone 18 may be terminated by an edge 19, which may have come into being, e.g., by dicing a chip out of a wafer.

Further, the active cell field 16 or, respectively, the active cell field 16 and the edge termination zone 18 may be configured to block a blocking voltage of at least 20 V, of at least 100 V, of at least 400 V or of at least 1000 V.

As schematically illustrated in FIG. 3A, the cells, e.g., their control electrodes 131, may exhibit a stripe configuration. Accordingly, each of the cells and the components they may comprise, e.g., the control electrodes 131, may extend along substantially the entire active cell field 16 along one of the first lateral direction X and the second lateral direction Y (as illustrated), e.g., bordering a transition region between the active cell field 16 and the edge termination zone 18. For example, the total lateral extension of a respective (stripe) cell amounts to less than 30%, less than 5%, or even less than 1% of the total extension of the active cell field 16 along one of the first lateral direction X and the second lateral direction Y.

In another embodiment that is schematically illustrated in FIG. 3B, the cells may exhibit a needle configuration (also referred to as cellular configuration) whose total lateral extensions along each of the first lateral direction X and the second lateral direction Y amount to only a fraction of the total lateral extensions along the first lateral direction X and the second lateral direction Y of the active cell field 16. For example, the total lateral extension of a respective needle cell amounts to less than 30%, less than 5%, or even less than 1% of the total extension of the active cell field 16 along one of the first lateral direction X and the second lateral direction Y.

In another embodiment, the active cell field 16 may comprise both types of cells, e.g., one or more cells in a stripe configuration and one or more cells in a needle configuration.

Both the active cell field 16 and the edge termination zone 18 may at least partially be formed within a joint semiconductor body 10 of the device 1. The semiconductor body 10 may be configured to carry the total load current that may be controlled, e.g., by means of the control electrodes 131. For example, the control electrodes 131 can be implemented as trench electrodes or a planar electrodes, as will be explained in more detail below with respect to FIGS. 1A-D and FIG. 2.

As has been explained above, the semiconductor device 1 described herein can be a bipolar power semiconductor device 1. Thus, the total load current within the semiconductor body 10 may be constituted by a first load current formed by first charge carriers of a first conductivity type and by a second load current formed by second charge carriers of a second conductivity type complimentary to the first conductivity type. For example, the first charge carriers are electrons and the second charge carriers are holes.

Regarding now each of FIGS. 1A-D, which each schematically and exemplarily illustrate a section of a vertical cross-section of the semiconductor device 1 in accordance with some embodiments, the semiconductor device 1 may comprise a first load terminal 11 and a second load terminal 12. For example, the first load terminal 11 is arranged separately from the second load terminal 12. The semiconductor body 10 may be coupled to each of the first load terminal 11 and the second load terminal 12 and may be configured to receive said load current via the first load terminal structure 11 and to output the load current via the second load terminal 12 and/or vice versa.

The semiconductor device 1 may exhibit a vertical set-up, according to which, for example, the first load terminal structure 11 is arranged on a frontside of the semiconductor device 1 and the second load terminal structure 12 is arranged on a backside of the semiconductor device 1. In another embodiment, the semiconductor device 1 may exhibit a lateral set-up, according to which, e.g., each of the first load terminal structure 11 and the second load terminal structure 12 are arranged on the same side of the semiconductor device 1.

For example, the first load terminal 11 comprises a first metallization, e.g., a frontside metallization, and the second load terminal 12 may comprise a second metallization, e.g., a backside metallization. Further, one or both of the first load terminal 11 and the second load terminal 12 may comprise a diffusion barrier.

Within the present specification, the direction of the total load current is expressed in the conventional manner, i.e., as a flow direction of positive charge carriers such as holes and/or as direction opposite to a flow of negative charge carriers such as electrons. A forward direction of the total load current may point, for example, from the second load terminal 12 to the first load terminal 11.

For controlling the load current, the semiconductor device 1 may further comprise said control electrode(s) 131. For example, the semiconductor device 1 may be configured to be set into one of the blocking state and the conducting state by means of said control electrode(s) 131. For example, said control electrodes 131 may be configured as planar control electrodes 131 or as trench control electrodes 131.

In an embodiment, for setting the semiconductor device 1 into a conducting state during which the load current in the forward direction may be conducted, the control electrode 131 may be provided with a control signal having a voltage within a first range. For setting the semiconductor device 1 into a blocking state during which a forward voltage may be blocked and flow of the load current in the forward direction is avoided, the control electrode 131 may be provided with the control signal having a voltage within a second range different from the first range.

In an embodiment, the control signal may be provided by applying a voltage between the control electrode 131 and the first load terminal 11 and/or by applying a voltage between the control terminal 13 and the second load terminal 12.

The power semiconductor device 1 may include a source region 101 electrically connected to the first load terminal 11. The source region 101 may be a semiconductor source region and, e.g., implemented in the semiconductor body 10. For example, the source region 101 has the first conductivity type, e.g., it comprises dopants of the first conductivity type, e.g., at a dopant concentration in the range of $10^{19}$ cm$^{-3}$ to $10^{22}$ cm$^{-3}$, e.g., $5*10^{19}$ cm$^{-3}$ to $1*10^{21}$ cm$^{-3}$.

The power semiconductor device 1 may further include a semiconductor channel region 102 that is implemented in the semiconductor body 10 and that may have the second conductivity type, e.g., it comprises dopants of the second conductivity type. The semiconductor channel region 102, in the following also referred to as channel region 102, may separate the source region 101 from a remaining portion of the semiconductor body 10, e.g., the semiconductor channel region 102 may isolate the source region 101 from at least one of the regions 103 and 104 presented below. It shall be understood that the channel region 102 may also be electrically connected to the first load terminal 11. For example, referring to the embodiment schematically illustrated in FIG. 2, a number of plugs 111 may be provided that may be configured to ensure the electrical connection between the first load terminal 11 on the one side and each of the source region 101 and the channel region 102 on the other side.

A transition between the source region 101 and the semiconductor channel region 102 may form a first junction 1012, e.g., a first pn-junction.

Figure 1C:
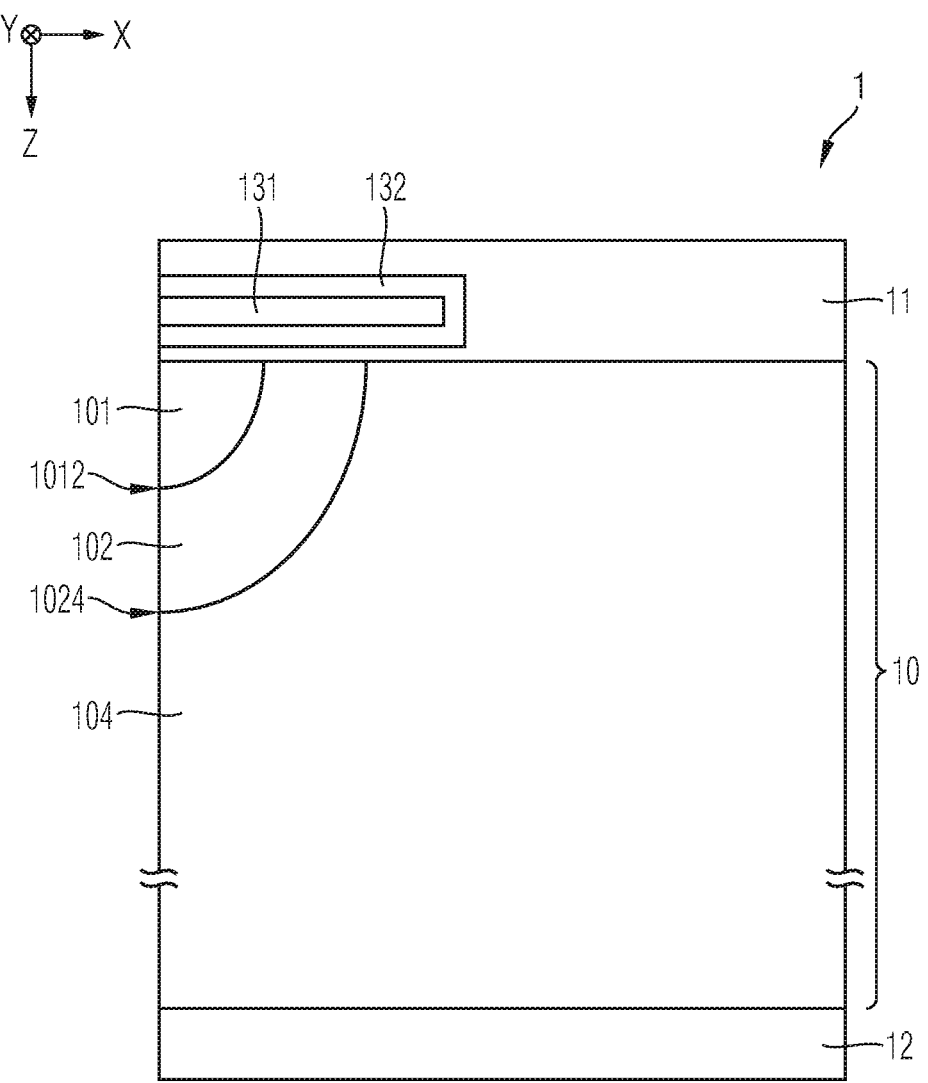

As indicated above, for controlling the load current in the semiconductor body 10, the semiconductor device 1 may comprise one or more control electrodes 131, which may be implemented as a trench electrode, as schematically illustrated in FIGS. 1A-B and in FIG. 2, or as a planar electrode, as schematically illustrated in FIGS. 1C-D. At this point, it shall already be emphasized that the embodiments in accordance with FIGS. 1A-B may also be provided with planar control electrodes 131 instead of trench control electrodes 131, and that the embodiments in accordance with FIGS. 1C-D may also be provided with trench control electrodes 131 instead of planar control electrodes 131.

Irrespective of its configuration (planar electrode or trench electrode), the control electrode 131 may be electrically insulated from each of the first load terminal 11 and the semiconductor body 10. To this end, the semiconductor device 1 may comprise an insulator 132 that insulates the control electrode 131. If the power semiconductor device 1 exhibits a trench architecture, as schematically illustrated in FIGS. 1A-B and in FIG. 2, the control electrode 131 and the insulator 132 may be included in a trench 13 of a first trench type. The trench 13 may exhibit a cellular configuration or stripe configuration (cf. FIGS. 3A-B).

For example, the control electrode 131 may be configured to control a path of the load current in the semiconductor channel region, e.g., by inducing an inversion channel in the channel region 102 so as to ensure flow of the load current and/or by breaking up the inversion channel so as to initiate the blocking state.

The semiconductor device 1 may further comprise a drift volume formed by at least a first drift region 104 that is implemented in the semiconductor body 10. In accordance with an embodiment, the first drift region 104 has the second conductivity type, e.g., it comprises dopants of the second conductivity type, e.g., of the same conductivity type as the dopants in the channel region 102. For example, the first drift region 104 is a weakly doped p-region. The first drift region 104 may be an electrically floating region; e.g., the first drift region 104 is not electrically connected, e.g., not in contact with the first load terminal 11, whereas, as indicated above, each of the source region 101 and the channel region 102 may be in contact with the first load terminal 11.

Thus, it shall be understood that, in accordance with an embodiment, the first drift region 104 can be doped with dopants of the same conductivity type as the dopants included in the channel region 102. Accordingly, an n-channel may be induced in a p-doped channel region 102 and, at the same time, the first drift region 104 that may be coupled to said p-doped channel region 102 (either directly or via a barrier region, as explained in more detail below) can be a p-drift region 104, in accordance with one or more embodiments.

The first drift region 104 may be coupled to the channel region 102. In accordance with an embodiment, e.g., as schematically and exemplarily illustrated in FIGS. 1C-D, the first drift region 104 may be in contact with the channel region 102. As emphasized above, the embodiments illustrated in FIGS. 1C-D may also be provided with trench control electrodes 131 instead of planar control electrodes 131. Accordingly, said embodiments may each include the trench 13 of the first trench type that each extends into the semiconductor body 10 along the extension direction Z and that is arranged adjacent to the semiconductor channel region 102, wherein the trench 13 may include the control electrode 131 and at least a part of the insulator 132, e.g., in a manner as illustrated in FIGS. 1A-B.

In accordance with another embodiment, e.g., as schematically and exemplarily illustrated in FIGS. 1A-B and in FIG. 2, the power semiconductor device 1 may optionally comprise a barrier region 103 that has the first conductivity type, e.g., it comprises dopants of the first conductivity type. For example, the barrier region 103 is an n-doped region. In an embodiment, this barrier region 103 may be electrically floating, e.g., the barrier region 103 is not electrically connected to the first load terminal 11. A transition between the barrier region 103 and the channel region 102 may form a second junction 1023, e.g., a second pn-junction. In an embodiment, the barrier region 103 may be configured to compensate or, respectively, to overcompensate an eventual reduction of a carrier confinement that may have been caused by including the first drift region 104 in the semiconductor body 10, e.g., around trench bottoms. In another embodiment, the barrier region 103 illustrated in FIG. 1A or in FIG. 1B is not provided, and the channel region 102 is arranged in contact with the first drift region 104.

If the barrier region 103 is provided, a transition between the barrier region 103 and the first drift region 104 may form a third junction 1034, for example a third pn-junction.

Regarding now an exemplary configuration of the semiconductor body 10 in proximity to the second load terminal 12, the semiconductor device 1 may comprise an emitter region 108 electrically connected to the second load terminal 12. An embodiment of such emitter region 108 is schematically illustrated in each of FIGS. 1A-B. For example, the emitter region 108 has the second conductivity type, e.g., it comprises dopants of the second conductivity type. The emitter region 108 can be a $p^+$-emitter region. In an embodiment, the emitter region 108 may also comprise emitter subregions (not illustrated) having dopants of the first conductivity type, e.g., $n^+$-emitter subregions, which may also be referred to as "n-shorts".

In an embodiment, the semiconductor device 1 may further comprise a buffer region 107 having the first conductivity type (e.g., it may comprise dopants of the first conductivity type) and being arranged in contact with said drift volume of the semiconductor body 10, said drift volume being at least partially formed by the first drift region 104, as has been explained above. For example, the buffer region 107 is $n^+$-doped region or an $n^{++}$-doped region. The buffer region 107 may also be referred to as field stop region. For example, the buffer region 107 may be arranged in contact with the emitter region 108 on the one side and may be coupled to said drift volume on the other side.

In an embodiment, e.g., as schematically illustrated in FIG. 1A, the buffer region 107 is arranged in contact with the first drift region 104, wherein a transition between the first drift region 104 comprising the dopants of the second conductivity type and the buffer region 107 comprising the dopants of first conductivity type may form a yet further junction 1047, e.g., a further pn-junction.

In another embodiment, e.g., as schematically illustrated in FIG. 1B, the drift volume may additionally be formed by a second drift region 105, wherein said second drift region 105 may have the first conductivity type, e.g., it may comprise dopants of the first conductivity type. For example, the first drift region 104 is a $p^-$-drift region and the second drift region 105 is an $n^-$-drift region. For example, the second drift region 105 extends further along the extension direction Z than the first drift region 104, e.g., the second drift region 105 may be arranged below the first drift region 104, e.g., in a sandwich like manner. For example, if present, the buffer region 107 may then be arranged in contact with the second drift region 105, wherein a transition 1057 between the second drift region 105 having the first conductivity type and the buffer region 107 also having the first conductivity type may thus form no junction, for example.

In an embodiment, the buffer region 107 exhibits a total extension DZ7 along the extension direction Z and its dopant concentration may increase for at least 20% of said total extension. The increase may occur along even more than 50%, e.g., for at least 70% of said total extension, for at least 90% of said total extension or for even more than 95% of said total extension.

Further, the first drift region 104, which may be arranged in contact with the buffer region 107 in an embodiment (cf. FIG. 1A), can exhibit a total extension along the extension direction Z and its dopant concentration may decrease for at least 50% of said total extension. Said decrease may occur along even more than 70%, e.g., for at least 80% of said total extension, for at least 90% of said total extension or for even more than 95% of said total extension. Accordingly, in an embodiment of the power semiconductor 1, the first drift region 104 is arranged in contact with the buffer region 107, wherein in proximity to said contact, e. g., in proximity to the further junction 1047, the dopant concentration of the first drift region 104 may decrease when approaching the further junction 1047 and the dopant concentration of the buffer region 107 may increase when departing from the further junction 1047.

Figure 4:
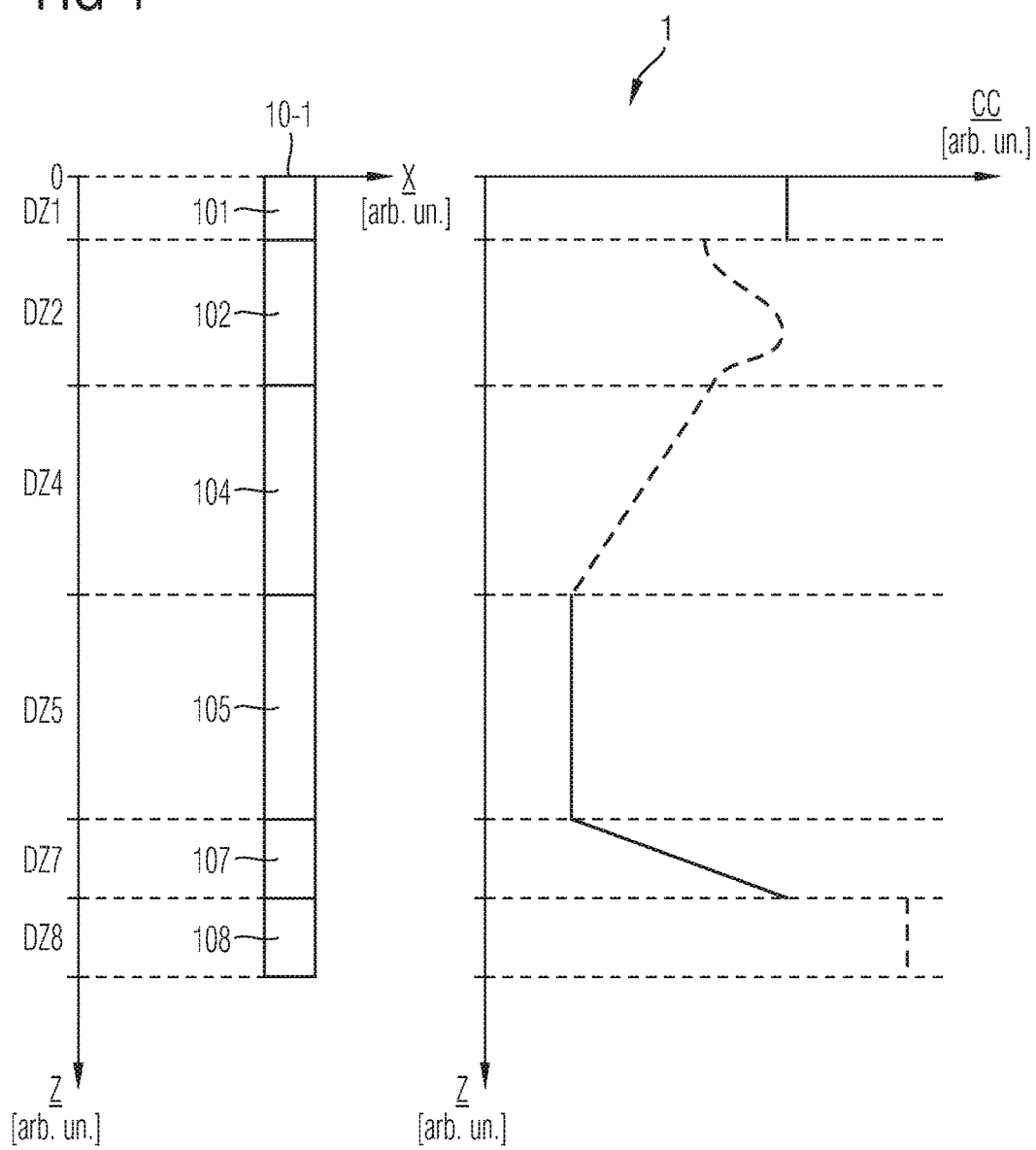
FIG. 4 schematically and exemplarily illustrates a section of a vertical cross-section of a bipolar power semiconductor device along with an exemplary illustration of courses of dopant concentrations in accordance with one or more embodiments.

Further exemplary dopant concentration profiles will be disclosed with respect to FIG. 4.

With respect to the embodiments in accordance with FIG. 1C or FIG. 1D, it shall be understood that the region of the semiconductor body 10 in proximity to the second load terminal 12 may be configured in a manner similar or identical to the embodiments illustrated in FIG. 1A or 1B. Accordingly, the semiconductor body 10 of the embodiment in accordance with FIG. 1C or of the embodiment in accordance with FIG. 1D may comprise at least one of the emitter region 108 arranged in contact with the second load terminal 12, and the buffer region 107, wherein said regions 107 and 108 may be configured in a manner as exemplarily described above.

Thus, it shall be understood that in accordance with every embodiment illustrated in FIGS. 1A to 5B, the power semiconductor device 1 may exhibit a power transistor configuration, e.g., an IGBT configuration or an RC-IGBT configuration, wherein the first drift region 104 may have the same conductivity type as the channel region 102, and wherein the first drift region 104 may be coupled to the channel region 102, e.g., in a direct manner such that the first drift region 104 is arranged in contact with the channel region 102, or in an indirect manner, namely by means of said barrier region 103, and wherein the control electrode 131 may be configured as a trench control electrode or as a planar control electrode.

Referring now to the embodiment is schematically illustrated in FIG. 1D, the drift volume may include one or more subregions 1041, wherein each of the one or more subregions 1041 contributes to less than 10% or to less than 5% of the total volume of the drift volume, e.g. of the volume of the first drift region 104. Further each of the one or more subregions 1041 may have either the first or the second conductivity type at a dopant concentration being greater by a factor of at least 100 than the dopant concentration of the first drift region 104. For example, the subregions 1041 are formed by one or more p$^+$-subregions and/or by one or more n$^+$-subregions. These one or more subregions 1041 may allow for increasing the short circuit robustness. For example, the concept of introducing highly doped subregions within a drift volume for increasing a short circuit robustness is also described in DE 10 2015 107 103 A1, the content of which is incorporated herein in its entirety. Thus, it shall be understood that, presently, the inventors have recognized that the measures for increasing the short circuit robustness as described in DE 10 2015 107 103 A1 may also be applied to the semiconductor device 1 in accordance with embodiments described herein. E.g., the one or more subregions 1041 may also be included in the drift volume comprising the first drift region 104 that may be doped with dopants of the same conductivity type as they are present in the channel region 102. As indicated in FIG. 1D, said one or more subregions 1041 may be arranged within the first drift region 104 of the drift volume, e.g., in a portion in proximity to the second load terminal 12, e.g., in proximity to a transition from the first drift region 104 to one of a buffer region and an emitter region (not illustrated in FIG. 1D; cf. regions 107 and 108 in other drawings, e.g., FIG. 1A). Further, if the drift volume of the semiconductor device 1 of FIG. 1D is additionally formed by the second drift region 105 (cf. e.g. FIG. 1B; not illustrated in FIG. 1D), said one or more subregions 1041 may additionally or alternatively be arranged within the second drift region 105, e.g., in a manner as described in DE 10 2015 107 103 A1.

Optional aspects of the embodiments according to FIGS. 1A-B and FIG. 2, where the control electrodes 131 may be included in a respective trench 13 of the first trench type, shall now be disclosed. For example, the trenches 13 of the first trench type extend in the semiconductor body 10 along the extension direction Z. They may each be arranged adjacent to a respective semiconductor channel region 102, e.g., so as to be able to control a path of the load current therein. The trenches 13 of the first trench type may each extend further along the extension direction Z into the semiconductor body 10 than each of the first junction 1012 and, if present, the second junction 1023, and also further than the third junction 1034, in accordance with an embodiment. For example, the control electrode 131 included in the trench 13 of the first trench type may extend further along the extension direction Z than each of the first junction 1012 and, if present, i.e., if the optional barrier region 103 is provided, the second junction 1023, and also further than the third junction 1034, in accordance with an embodiment. In another embodiment (not illustrated), the third junction 1034 is arranged deeper than the bottom of the trench 13. Again, it shall be understood that the barrier region 103 must not necessarily be provided. If the barrier region 103 is not provided, the first drift region 104 may be arranged in contact with the channel region 102 and, accordingly, in this case the second junction 1023 and the third junction 1034 are not established, as has been elucidated above.

Further, the trenches 13 of the first trench type may each exhibit a total extension DZT, measured from a surface 10-1 of the semiconductor body 10, along the extension direction Z, wherein the third junction 1034 formed by the transition between the barrier region 103 and the first drift region 104 is arranged within a level in the range of 50% to 95% of said total extension DZT. Further, transition along the extension direction from the first drift region 104 to a remaining portion of the semiconductor body 10, e.g., the transition 1047 or the transition 1045, can be arranged within a level greater than 200% of said total extension DZT. Thus, the transition 1047 or the transition 1045 may be arranged significantly below the bottoms of the trenches 13.

The first drift region 104 can be arranged in contact with at least a respective lower section of the trenches 13, the respective lower section amounting to at least 10% of said total extension DZT. In other words, said lower trench sections may be embedded within the first drift region 104 that may comprise the dopants of the second conductivity type.

As illustrated, the semiconductor device 1 may comprise a plurality of trenches 13 of said first trench type, wherein said trenches 13 can be are arranged along the first lateral direction X, forming, e.g., a micro pattern trench (MPT) structure. Further, referring to the embodiment schematically illustrated in FIG. 2, the power semiconductor device 1 may comprise a plurality of trenches 17 of a second trench type arranged along a first lateral direction X, wherein each trench 17 of the second type extends in the semiconductor body 10 along the extension direction Z, and wherein each trench 17 of the second trench type may include a trench electrode 171 that is insulated from the semiconductor body 10 by a trench insulator 172. Whereas the control electrodes 131 included in the trenches 13 of the first trench type may be electrically connected to each other, the trench electrodes 171 included in the trenches 17 of the second trench type can be electrically insulated from the control electrodes 131, in accordance with an embodiment. Nevertheless, the trench electrodes 171 may exhibit equal spatial dimensions as compared to the control electrodes 131 and may also be made of the same material as the control electrodes 131. For example, the trench electrodes 171 are implemented as so-called field plates and may be electrically connected to a fixed electrical potential, e.g., to the first load terminal 11. In an embodiment, a trench 13 of the first trench type is arranged adjacent to two trenches 17 of the second trench type, and a trench 17 of the second trench type is arranged adjacent to two trenches 13 of the first trench type, as schematically illustrated in FIG. 2.

Each of the trenches 13 of the first trench type and each of the trenches 17 of the second trench type may traverse each of the semiconductor channel region 102, the barrier region 103 (if present) and may further extends into the first drift region 104. For example, adjacent trenches—which may either be two trenches 13 of the first trench type, two trenches 17 of the second trench type, or one first trench type trench 13 and one second trench type trench 17—may be separated from each other by a respective mesa zone 14 along the first lateral direction X. Each mesa zone 14 may exhibit a width WM within the range of 10 nm to 10 μm, for example. Further, each mesa zone 14 may comprises a section of each of the source region 101, the semiconductor channel region 102, the barrier region 103 (if present) and the first drift region 104. Accordingly, in an embodiment, the first drift region 104 may extend into the mesa zones 14. As illustrated in each of FIGS. 1A-B and FIG. 2, the barrier region 103 may entirely be arranged with the mesa zones 14.

Even though each of FIGS. 1A-B and FIG. 2 illustrate the barrier region 103 within the mesa zones 104, it shall be understood that this barrier region 103 must not necessarily be present in the illustrated embodiments. For example, if the barrier region 103 is absent, the first drift region 104 may extend further against the extension direction Z and may be arranged in contact with the channel regions 102, as it is the case in accordance with the embodiment schematically illustrated in FIGS. 1C-D. Then, what has been stated above with regards to the total extension of the trenches 13 of the first trench type may also apply with respect to a transition between the channel region 102 and the first drift region 104 (cf. e.g., transition 1024 indicated in FIGS. 1C-D). Accordingly, the trenches 13 of the first trench type may then each extend further along the extension direction Z into the semiconductor body 10 than said transition 1024, in accordance with an embodiment. For example, the control electrode 131 included in the trench 13 of the first trench type may also extend further along the extension direction Z than said transition 1024, in accordance with an embodiment. Further, regarding the embodiments in accordance with FIG. 1C or FIG. 1D, it shall be understood that these embodiments may also include at least one of said second drift region 105, a buffer region 107 and an emitter region 108.

As has already been explained with respect to FIGS. 3A-B, the power semiconductor device 1 may comprise an active cell field 16 and an edge termination zone 18 surrounding the active cell field 16. For example, the first drift region 104 having the second conductivity type is exclusively arranged in the active cell field 16. There are a number of possibilities how to ensure that the first drift region 104 extends only within the active cell field 16, one of which is schematically and exemplarily illustrated in FIG. 3C. In the embodiment illustrated in FIG. 3C, the drift volume of the semiconductor device 1 may be constituted by the first drift region 104 and the second drift region 105.

Regarding the active cell field 16, on the one side facing to the second load terminal 12, the first drift region 104 may thus be arranged in contact with the second drift region 105, which may be positioned below with the first drift region 104. On the other side facing to the first load terminal 11, the first drift region 104 may be coupled to portions of the semiconductor body 10 that may be electrically connected to the first load terminal 11 and that may be controlled by the control electrodes 131, e.g., the first drift region 104 may be coupled to the channel region 102, e.g. directly or, if present, by means of the barrier region 103 (not illustrated in FIG. 3C).

Figure 3C:
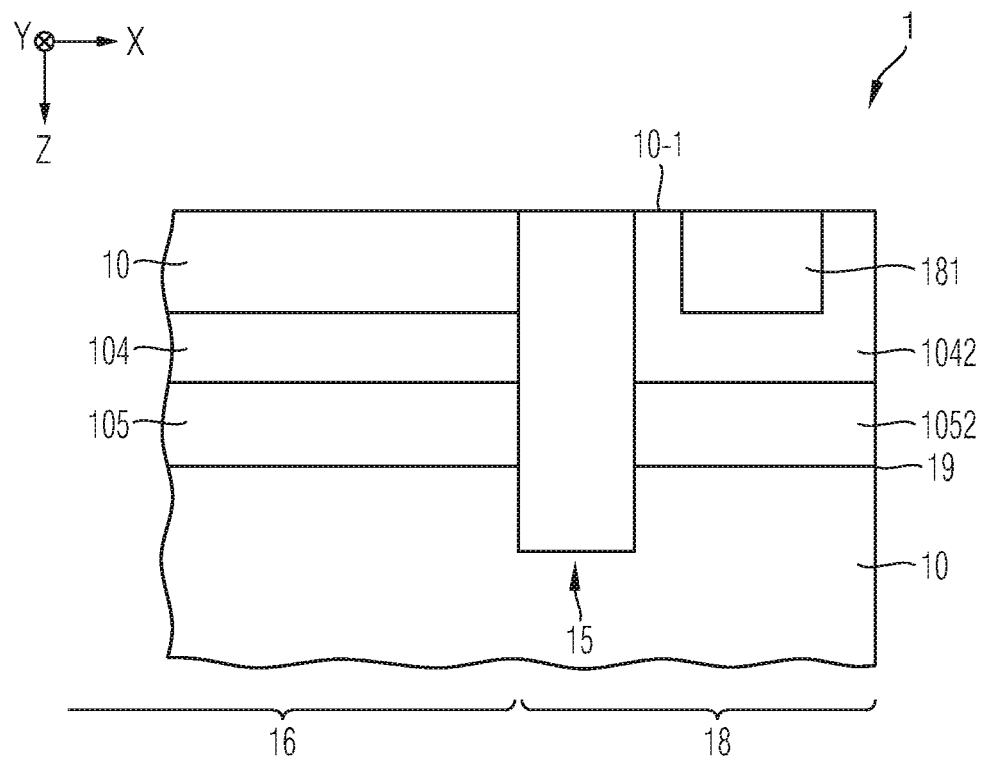
FIG. 3C schematically and exemplarily illustrates a section of a vertical cross-section of a bipolar power semiconductor device in accordance with one or more embodiments.

A transition from the active cell field 16 to the edge termination zone 18 may comprise a deep trench 15 that extends from the surface 10-1 along the extension direction Z and that may entirely traverse the first drift region 104. For example, if the first drift region 104 is implemented as a first drift layer 104, the deep trench 15 may interrupt this layer 104 such that a boarder layer portion 1042 within the edge termination zone 18 is separated from the remaining part of the first drift region 104 and is not contact anymore to said portions of the semiconductor body 10 that may be may be electrically connected to the first load terminal 11 and that may be controlled by the control electrodes 131. If the semiconductor device 1 further comprises the second drift region 105, as schematically illustrated in FIG. 3C, the deep trench 15 may also entirely traverse the second drift region 105 such that a boarder region portion 1052 in the edge termination zone 18 is separated from the remaining part of the second drift region 105. Further, within the edge termination zone 18, there may be included one or more guard rings 181, as they are known to the skilled person. In another embodiment, the one or more guard rings 181 are not provided in the edge termination zone 18 that is separated from the active cell field 16 by means of the deep trench 15. Further, the if the edge termination zone 18 is separated from the active cell field 16 by means of the deep trench 15, the edge termination zone 18 may be formed by a substantially unstructured semiconductor region, comprising, e.g., dopants of the first conductivity type.

For example, referring again to FIGS. 3A-B, the cells of the active cell field 16 that are arranged closest to the edge termination zone 18 may be configured in a manner as illustrated in one of FIGS. 1A-2, but without the source region 101. E.g., the cells of the active cell field 16 that are arranged closest to the edge termination zone 18 may be configured similar to the remaining cells of the active cell field 16, but with the difference that these cell do not exhibit the source region 101. Rather, a source region for these "boundary" cells is not provided and these cells, even though belonging to the active cell field 16, do not conduct any load current, in accordance with an embodiment.

In accordance with a further embodiment, also a method of processing a power semiconductor device 1 having a semiconductor body 10 is presented. For example, the method comprises creating a source region 101 with a first conductivity type, e.g., by carrying out at least one of an epitaxy processing step, a diffusion processing step, and an implantation step. Further, the method may comprise creating a semiconductor channel region 102 in the semiconductor body 10 with a second conductivity type, e.g., by carrying out at least one of an epitaxy processing step, a diffusion processing step, and an implantation step, such that the semiconductor channel region 102 separates the source region 101 from a remaining portion of the semiconductor body 10. Further, the method may include providing a control electrode 131 for controlling a path of a load current in the semiconductor channel region 102, and an insulator 132 that insulates the control electrode 131 from the semiconductor body 10. The method may further include: creating at least one emitter region 108 of the second conductivity type in the semiconductor body 10; and creating a drift volume having at least a first drift region 104 in the semiconductor body 10 with the second conductivity type, e.g., by carrying out at least one of an epitaxy processing step, a diffusion processing step, and an implantation step such that the first drift region 104 is coupled with the semiconductor channel region 102; and creating a buffer region 107 of the first conductivity type and being arranged between the drift volume of the semiconductor body 10 on one side and the emitter region 108 on the other side. Creating the first drift region 104 may occur prior to creating the source region 101, the channel region 102 and also prior to creating the control electrode 131. What has been stated above regarding the embodiments of the power semiconductor device 1, e.g., its components 10, 11, 12, 101, 102, 103, 104, 105, 107, 108 may analogously apply to the embodiment of the method of processing a power semiconductor device.

FIG. 4 schematically and exemplarily illustrates a section of a vertical cross-section of the power semiconductor device 1 along with an exemplary illustration of courses of dopant concentrations CC in the extension direction Z accordance with one or more embodiments. For example, the source region 101, which may begin at the surface 10-1 of the semiconductor body 10, may exhibit a total extension DZ1 in the extension direction Z within the range of 0.05 μm to 2 μm, or within the range of 0.1 μm to 0.5 μm. For example, the concentration of the dopants of the first conductivity type is substantially constant along said total extension DZ1, e.g., the dopant concentration is within the range of 1e18 cm$^{-3}$ to 1e21 cm$^{-3}$, or within the range of 1e19 cm$^{-3}$ to 5e20 cm$^{-3}$. As already indicated, below the source region 101, there may be arranged the channel region 102.

For example, the channel region 102 may exhibit a total extension DZ2 in the extension direction Z within the range of 0.5 μm to 5 μm, or within the range of 1.0 μm to 3.5 μm. For example, the concentration of the dopants of the second conductivity varies along said total extension DZ2, e.g., the dopant concentration is within the range of 1e16 cm$^{-3}$ to 1e18 cm$^{-3}$, or within the range of 1e17 cm$^{-3}$ to 5e17 cm$^{-3}$, and exhibits, for example, a peak in a central part of the channel region 102.

As further been explained above, the first drift region 104 having the dopants of the second conductivity type may be arranged below the channel region 102 and may be coupled thereto, for example directly, i.e., in contact to the channel region 102, or by means of the barrier region 103, which is not illustrated in FIG. 3 and which must not necessarily be present in the semiconductor body 10. For example, the first drift region 104 may exhibit a total extension DZ4 in the extension direction Z within the range of 5 µm to 200 µm, or within the range of 5% to 50% of the total thickness of the semiconductor body 10 in the extension direction Z, or within the range of 20 µm to 100 µm. The thickness DZ4 may depend on a desired voltage rating of the semiconductor device 1. Further, with regards to the method of processing a bipolar power semiconductor device described above, it shall be understood that providing the first drift region 104 with the thickness DZ4 (amounting, e.g., to at least 5% of the thickness of the semiconductor body 10) can include a step of back thinning and/or polishing a substrate; e.g., said thickness DZ4 may be provided after the entire processing of the bipolar power semiconductor device has been finished. For example, the concentration of the dopants of the second conductivity varies along said total extension DZ4, e.g., the dopant concentration is within the range of 2e12 cm$^{-3}$ to 2e15 cm$^{-3}$, or within the range of 5e12 cm$^{-3}$ to 3e14 cm$^{-3}$, or within the range 1*10$^{13}$ cm$^{-3}$ to 2*10$^{15}$ cm$^{-3}$, and the dopant concentration may decrease along the extension direction Z, as schematically illustrated in FIG. 4, e.g. for at least 50% of said total extension DZ4. Said decrease may occur along even more than 70%, e.g., for at least 80% of said total extension DZ4, for at least 90% of said total extension DZ4 or for even more than 95% of said total extension DZ4. For example, the decrease in dopant concentration amounts to a factor of at least 2, starting from a value present in an upper half of said total extension DZ4. In another embodiment, the dopant concentration of the first drift region 104 may be substantially constant along the total extension DZ4.

As indicated above, the semiconductor body 10 may further comprise a second drift region 105, wherein it shall be understood that this second drift region 105 must not necessarily be present. Thus, in contrast to the schematic illustration in FIG. 4, along the extension direction Z, the first drift region 104 may directly contact the buffer region 107, in accordance with an embodiment, e.g., by the first drift region 104 extending further along the extension direction Z and by the buffer region 107 extending further against the extension direction Z. If present, the second drift region 105 may exhibit a total extension DZ5 in the extension direction Z within the range of 10 µm to 650 µm, or within the range of 40 µm to 200 µm, or within the range of 15% to 80% of the total thickness of the semiconductor body 10 in the extension direction Z. Also, thickness DZ5 may depend on a desired voltage rating of the semiconductor device 1. For example, the concentration of the dopants of the first conductivity type is substantially constant along said total extension DZ5, e.g., the dopant concentration is within the range of 2e12 cm$^{-3}$ to 4e14 cm$^{-3}$, or within the range of 5e12 cm$^{-3}$, to 9e13 cm$^{-3}$. For example, said dopant concentration is determined in dependence on a desired voltage rating of the semiconductor device 1.

Regarding now the buffer region 107, which may be, as indicated above, arranged directly in contact with the first drift region 104, the buffer region 107 may exhibit a total extension DZ7 in the extension direction Z within the range of 1 µm to 50 µm, or within the range of 5 µm to 30 µm. Also, thickness DZ7 may depend on a desired voltage rating of the semiconductor device 1. For example, the concentration of the dopants of the first conductivity varies along said total extension DZ7; the maximum dopant concentration can be within the range of 1e14 cm$^{-3}$ to 5e18 cm$^{-3}$, or within the range of 2e14 cm$^{-3}$ to 5e16 cm$^{-3}$, and the dopant concentration may increase along the extension direction Z, as schematically illustrated in FIG. 4, e.g. for at least 30%, for at least 50% or for at least 70% of said total extension DZ7. Said increase may occur along even more than 70%, e.g., for at least 80% of said total extension DZ7, for at least 90% of said total extension DZ7 or for even more than 95% of said total extension DZ7. For example, the increase in dopant concentration amounts to a factor of at least 2, starting from a value present in an upper half of said total extension DZ7.

Further, the semiconductor body 10 may include the emitter region 108, which may be in contact with the second load terminal 12 and which may comprise dopants of the second conductivity type. For example, the emitter region 108 may exhibit a total extension DZ8 in the extension direction Z within the range of 0.02 µm to 15 µm, or within the range of 0.2 µm to 1 µm. For example, the concentration of the dopants of the first conductivity type is substantially constant along said total extension DZ8 or said concentration may follow a Gaussian-like course, e.g., the dopant concentration is within the range of 5e16 cm$^{-3}$ to 1e21 cm$^{-3}$, or within the range of 1e17 cm$^{-3}$ to 1e18 cm$^{-3}$.

Figure 5A:
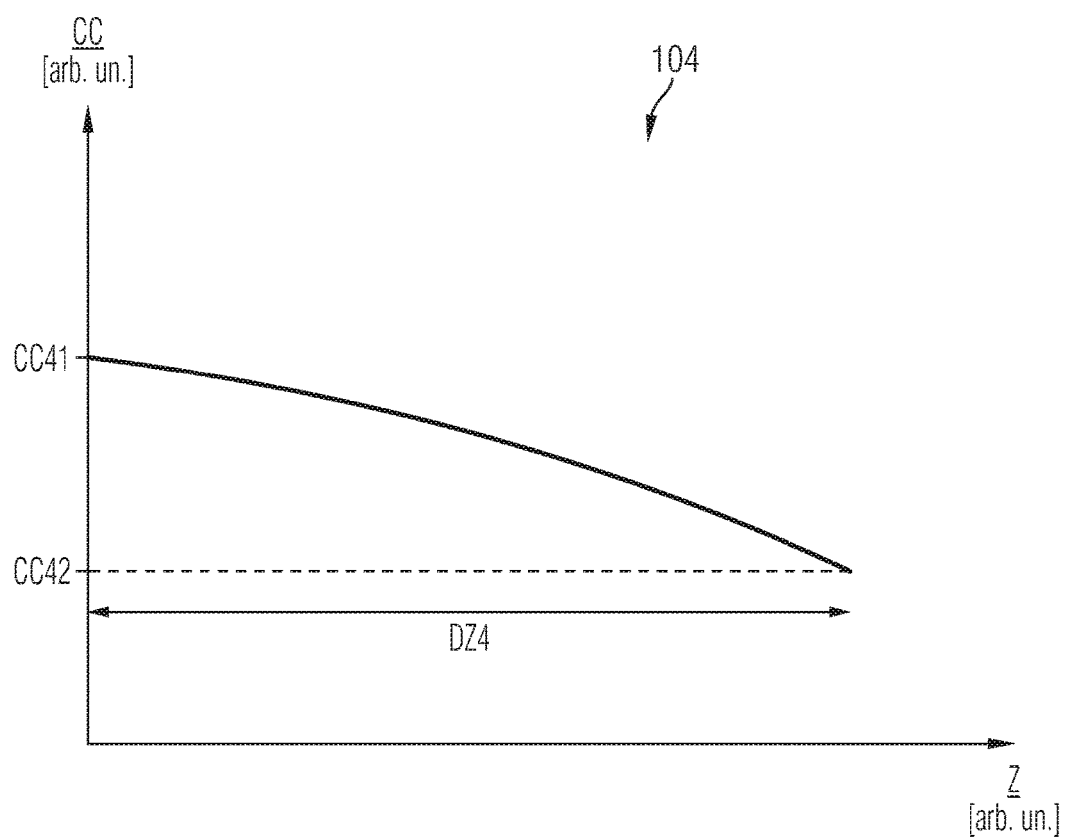
FIG. 5A schematically and exemplarily illustrates a course of a dopant concentration in an extension direction in accordance with one or more embodiments.

FIG. 5A schematically and exemplarily illustrates a course of a dopant concentration CC of an embodiment of the first drift region 104 in the extension direction Z in accordance with one or more embodiments. For example, the first drift region 104 may exhibit a total extension DZ4 in the extension direction Z amounting to approximately 40 µm. For example, the concentration of the dopants of the second conductivity decreases along substantially the entire total extension DZ4, e.g., a start value CC41 within the range of 1e13 cm$^{-3}$ to 2e15 cm$^{-3}$ down to an end value CC42 within the range of 2e12 cm$^{-3}$ to 2e13 cm$^{-3}$. For example, the start value CC41 may be present in proximity to the transition between the channel region 102 and the first drift region 104 (cf. e.g., transition 1024 indicated in FIGS. 1C-D), and the end value CC42 may be present in proximity to a transition between the first drift region 104 and the buffer region 107 (cf. e.g., transition 1047 indicated in FIGS. 1A-B). As the first drift region 104 may be terminated, along the extension direction Z, by a semiconductor region that has dopants of the first conductivity type, i.e., terminated by a junction, said end value CC42 may be substantially lower, e.g. close to zero. The decrease may occur along even more than 70%, e.g., for at least 80% of said total extension DZ4, for at least 90% of said total extension DZ4 or for even more than 95% of said total extension DZ4. For example, the decrease may exhibit a substantially linear course or, in another embodiment, an exponential course. Instead of decreasing, the dopant concentration may also be constant or increase along the extension direction Z. Alternatively or additionally, the dopant concentration in the first drift region 104 may also exhibit one or more maxima or minima along the extension direction Z or may exhibit graded or stepped profile, or a turtle shell profile, in accordance with one or more other embodiments.

As indicated above, the power semiconductor device 1 may be operable in a blocking state and in a conducting state. FIG. 5B schematically and exemplarily illustrates a course of an electric field strength E in the extension direction Z during the blocking state in accordance with one or more embodiments. Thus, a voltage may be applied between the load terminals 12 and 11 and flow of a load current is prevented, e.g., by means of providing a corresponding control signal to the control electrodes 131 such that inducement of an inversion channel in the channel region 102 is prevented. Further, the semiconductor body 10 may exhibit a total extension in the extension direction Z amounting to the sum of ten equal tenth parts, as indicated in FIG. 5B. If the power semiconductor device 1 is operated in the blocking state, an absolute maximum AM of electric field strength E caused by the blocking voltage applied between the first load terminal 11 and the second load terminal 12 occurs within six central parts CP of said tenth parts of the total extension of the semiconductor body 10. For example, the exact position of the absolute maximum AM can be adjusted by means of the dopant profile and/or by means of the total extension DZ4 and/or by means of the position of the first drift region 104. For example, by shifting the absolute maximum AM towards a central region of the semiconductor body 10, e.g., in proximity to the centre between the first load terminal 11 and the second load terminal 12, a cosmic ray robustness of the semiconductor device 1 may be increased. Further, if implemented in trench architecture, the absolute maximum AM of the electric field strength can also be shifted away from the trench bottoms, which may further increase the robustness of the semiconductor device 1, e.g., due to lower stresses on the insulator 132, e.g., due to lower trench oxide degradation, and/or due to a reduction of a risk in avalanche induced fails, in accordance with one or more embodiments.

The embodiments described above include the recognition that some of currently known IGBTs are rated in such a way that there is a significant gap between breakdown voltage and a typical DC-link voltage. For instance, a 1200 V-IGBT is operating at a DC-link voltage between 600V and 800V or a 6.5 kV-IGBT is operated at a DC-link voltage of 3600V. There can be several reasons for this gap: For example, a stray inductance in a power circuit may cause voltage peaks during IGBT turn-off that can trigger strong dynamic avalanche and device destruction under overload conditions, e.g., high current, high voltage. Further, cosmic rays may generate secondary high energy particles that are constantly penetrating the atmosphere. Such secondary particle, e.g., neutrons, can cause the breakdown of the device. There can be an exponential dependency of such a device failure on the applied voltage. In terms of losses, one may want to reduce the voltage rating of the IGBTs for a given application, e.g., use a 900 V-IGBT where nowadays a 1200 V-IGBTs is used.

In accordance with one or more embodiments, the power semiconductor device 1 exhibits an IGBT-configuration, wherein the drift volume of the IGBT-configuration of the power semiconductor device 1 comprises, either additionally or alternatively to the regularly provided drift region, said first drift region 104 having the same conductivity type as the channel region 102. For example, the power semiconductor device 1 exhibits an n-channel IGBT-configuration, wherein the drift volume of the n-channel IGBT-configuration of the power semiconductor device 1 comprises, either additionally or alternatively to the regularly provided n-drift region, said first drift region 104 implemented as a p-doped region, e.g., a p-layer. In another embodiment, the power semiconductor device 1 exhibits a p-channel IGBT-configuration, wherein the drift volume of the p-channel IGBT-configuration of the power semiconductor device 1 comprises, either additionally or alternatively to the regularly provided p-drift region, said first drift region 104 implemented as an n-doped region, e.g., an n-layer.

In accordance with one or more embodiments presented above, the cosmic ray robustness can be increased by means of the first drift region 104 that comprises the dopants of the second conductivity type, e.g., of the same conductivity type as the channel region 102. For example, an n-channel IGBT is equipped with a p-drift region instead of or in addition to an n-drift region, in accordance with one or more embodiments.

In the above, embodiments pertaining to semiconductor device processing methods were explained. For example, these semiconductor devices are based on silicon (Si). Accordingly, a monocrystalline semiconductor region or layer, e.g., the regions 10, 101, 102, 103, 104, 1041, 105, 107, 108 of exemplary embodiments, can be a monocrystalline Si-region or Si-layer. In other embodiments, polycrystalline or amorphous silicon may be employed.

It should, however, be understood that the semiconductor body 10 and components, e.g., regions 100, 110, 101 and 12 can be made of any semiconductor material suitable for manufacturing a semiconductor device. Examples of such materials include, without being limited thereto, elementary semiconductor materials such as silicon (Si) or germanium (Ge), group IV compound semiconductor materials such as silicon carbide (SiC) or silicon germanium (SiGe), binary, ternary or quaternary III-V semiconductor materials such as gallium nitride (GaN), gallium arsenide (GaAs), gallium phosphide (GaP), indium phosphide (InP), indium gallium phosphide (InGaPa), aluminum gallium nitride (AlGaN), aluminum indium nitride (AlInN), indium gallium nitride (InGaN), aluminum gallium indium nitride (AlGaInN) or indium gallium arsenide phosphide (InGaAsP), and binary or ternary II-VI semiconductor materials such as cadmium telluride (CdTe) and mercury cadmium telluride (HgCdTe) to name few. The aforementioned semiconductor materials are also referred to as "homojunction semiconductor materials". When combining two different semiconductor materials a heterojunction semiconductor material is formed. Examples of heterojunction semiconductor materials include, without being limited thereto, aluminum gallium nitride (AlGaN)-aluminum gallium indium nitride (AlGaInN), indium gallium nitride (InGaN)-aluminum gallium indium nitride (AlGaInN), indium gallium nitride (InGaN)-gallium nitride (GaN), aluminum gallium nitride (AlGaN)-gallium nitride (GaN), indium gallium nitride (InGaN)-aluminum gallium nitride (AlGaN), silicon-silicon carbide (SixC1-x) and silicon-SiGe heterojunction semiconductor materials. For power semiconductor devices applications currently mainly Si, SiC, GaAs and GaN materials are used.

Spatially relative terms such as "under", "below", "lower", "over", "upper" and the like, are used for ease of description to explain the positioning of one element relative to a second element. These terms are intended to encompass different orientations of the respective device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising", "exhibiting" and the like are open ended terms that indicate the presence of stated elements or features, but do not preclude additional elements or features. The articles "a", "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A bipolar power semiconductor device having a semiconductor body configured to conduct a load current between a first load terminal and a second load terminal of the power semiconductor device, the bipolar power semiconductor device further comprising:
 a source region of a first conductivity type and being electrically connected to the first load terminal;
 a semiconductor channel region implemented in the semiconductor body and having a second conductivity type and separating the source region from a remaining portion of the semiconductor body;
 a trench of a first trench type extending in the semiconductor body along an extension direction and being arranged adjacent to the semiconductor channel region, the trench of the first trench type including a control electrode that is insulated from the semiconductor body by an insulator, wherein the control electrode is configured to control a path of the load current in the semiconductor channel region;
 at least one emitter region of the second conductivity type implemented in the semiconductor body and being electrically connected to the second load terminal;
 wherein the semiconductor body further comprises:
 a drift volume having at least a first drift region of the second conductivity type, wherein a transition between the first drift region and a remaining portion of the semiconductor body in the extension direction is arranged below the bottom of the trench,
 a buffer region of the first conductivity type being arranged between the drift volume of the semiconductor body on one side and the emitter region on the other side,
 the buffer region having an increasing dopant concentration for at least 20% of the total extension of the buffer region along the extension direction,
 wherein a second drift region of the first conductivity type arranged between the first drift region and the buffer region and having a lower doping concentration than the buffer region has a total extension along an extension direction of less than 80% of the total extension of the semiconductor body along the extension direction.

2. The bipolar power semiconductor device of claim 1, wherein a thickness of the at least one emitter region is less than 1 µm.

3. The bipolar power semiconductor device of claim 1, wherein the first drift region is electrically floating.

4. The bipolar power semiconductor device of claim 1, wherein the first drift region is arranged in contact with at least a lower section of the trench.

5. The bipolar power semiconductor device of claim 1, wherein the first drift region does not extend outside of an active cell field.

6. The bipolar power semiconductor device of claim 1, wherein the first drift region adjoins the buffer region.

7. The bipolar power semiconductor device of claim 1, wherein the first drift region is directly connected to the semiconductor channel region.

8. The bipolar power semiconductor device of claim 1, wherein the semiconductor body further comprises:
 a barrier region of the first conductivity type between the semiconductor channel region and the first drift region.

9. The bipolar power semiconductor device of claim 4, further comprising:
 a plurality of trenches arranged in contact with the first drift region.

10. The bipolar power semiconductor device of claim 9, wherein the plurality of trenches comprise a trench of a second trench type.

11. The bipolar power semiconductor device of claim 10, wherein the trench of the second trench type comprises a trench electrode that is electrically insulated from the control electrode.

12. The bipolar power semiconductor device of claim 11, wherein the trench electrode of the trench of the second trench type is electrically connected to the first load terminal.

13. A bipolar power semiconductor device having a semiconductor body comprising:
 a source region of a first conductivity type;
 a semiconductor channel region implemented in the semiconductor body and having a second conductivity type and separating the source region from a remaining portion of the semiconductor body;
 a trench extending in the semiconductor body along an extension direction and being arranged adjacent to the semiconductor channel region;
 an emitter region of the second conductivity type implemented in the semiconductor body;
 a drift volume having a first drift region of the second conductivity type, wherein a transition between the first drift region and a remaining portion of the semiconductor body in the extension direction is arranged below the bottom of the trench;
 a buffer region of the first conductivity type being arranged between the drift volume and the emitter region, the buffer region having an increasing dopant concentration for at least 20% of the total extension of the buffer region along the extension direction; and
 a second drift region of the first conductivity type arranged between the first drift region and the buffer region and having a lower doping concentration than the buffer region and a total extension along an extension direction of less than 80% of the total extension of the semiconductor body along the extension direction.

14. The bipolar power semiconductor device of claim 13, wherein a thickness of the emitter region is less than 1 µm.

15. The bipolar power semiconductor device of claim 13, wherein the first drift region is electrically floating.

16. The bipolar power semiconductor device of claim 13, wherein the first drift region is arranged in contact with at least a lower section of the trench.

17. The bipolar power semiconductor device of claim 13, further comprising:
 a plurality of trenches arranged in contact with the first drift region.

18. The bipolar power semiconductor device of claim 13, wherein the first drift region adjoins the buffer region.

19. The bipolar power semiconductor device of claim 13, wherein the first drift region is directly connected to the semiconductor channel region.

20. The bipolar power semiconductor device of claim 13, further comprising:
 a barrier region of the first conductivity type between the semiconductor channel region and the first drift region.

* * * * *